United States Patent
Yamamoto et al.

(10) Patent No.: US 10,562,776 B2
(45) Date of Patent: Feb. 18, 2020

(54) DIAMOND SINGLE CRYSTAL, TOOL, AND METHOD FOR PRODUCING DIAMOND SINGLE CRYSTAL

(71) Applicant: Sumitomo Electric Industries, Ltd., Osaka-shi (JP)

(72) Inventors: Katsuko Yamamoto, Itami (JP); Keiko Arimoto, Itami (JP); Hitoshi Sumiya, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/574,744

(22) PCT Filed: Jun. 1, 2016

(86) PCT No.: PCT/JP2016/066178
§ 371 (c)(1),
(2) Date: Nov. 16, 2017

(87) PCT Pub. No.: WO2016/203950
PCT Pub. Date: Dec. 22, 2016

(65) Prior Publication Data
US 2018/0141818 A1    May 24, 2018

(30) Foreign Application Priority Data

Jun. 19, 2015  (JP) ................................. 2015-123783

(51) Int. Cl.
| | |
|---|---|
| *C01B 32/25* | (2017.01) |
| *B01J 3/06* | (2006.01) |
| *B23B 27/20* | (2006.01) |
| *B24B 53/047* | (2006.01) |
| *C30B 29/04* | (2006.01) |

(52) U.S. Cl.
CPC ............... *C01B 32/25* (2017.08); *B01J 3/06* (2013.01); *B23B 27/20* (2013.01); *B24B 53/047* (2013.01); *C30B 29/04* (2013.01)

(58) Field of Classification Search
None
See application file for complete search history.

(56) References Cited

U.S. PATENT DOCUMENTS

| | | | |
|---|---|---|---|
| 2004/0175499 A1* | 9/2004 | Twitchen | ............... C30B 29/04 427/249.8 |
| 2012/0047950 A1* | 3/2012 | Grotjohn | ............... A44C 17/003 63/32 |
| 2013/0143022 A1* | 6/2013 | Schreck | ............... C23C 16/0281 428/220 |

FOREIGN PATENT DOCUMENTS

EP        0525207 A1    2/1993

OTHER PUBLICATIONS

Huang et al., "Preparation of IaA-type diamond crystals containing a high concentration of nitrogen by annealing {111}-oriented N-doped diamond crystals," Int. Journal of Refractory Metals and Hard Materials 41 (2013) pp. 517-521.

* cited by examiner

Primary Examiner — Guinever S Gregorio
(74) Attorney, Agent, or Firm — Baker Botts L.L.P.; Michael A. Sartori

(57) ABSTRACT

The present diamond single crystal is a diamond single crystal containing nitrogen atoms, in which a concentration of the nitrogen atoms changes periodically along a crystal orientation of the diamond single crystal, and an arithmetic average value $A_{ave}$, a maximum value $A_{max}$, and a minimum value $A_{min}$ of the distance of one period along the crystal orientation satisfy the relationship expressed by the following equation (I):

$$(A_{max})/1.25 \leq (A_{ave}) \leq (A_{min})/0.75 \qquad (I).$$

12 Claims, 4 Drawing Sheets

DIAMOND SINGLE CRYSTAL, TOOL, AND METHOD FOR PRODUCING DIAMOND SINGLE CRYSTAL

TECHNICAL FIELD

The present invention relates to a diamond single crystal, a tool, and a method for producing a diamond single crystal.

The present application claims a priority based on Japanese patent application No. 2015-123783 filed on Jun. 19, 2015, and all of the contents described in the Japanese patent application are incorporated by reference.

BACKGROUND ART

A single crystal diamond having high hardness and high strength, and further being excellent in thermal conductivity is industrially used in a wide range of applications including in addition to a wear-resistant tool such as a tool for grindstone dresser, a die for wire drawing, a scribe tool, an orifice for water jet, and a wire guide, a diamond tool for cutting, and the like.

As a single crystal diamond used for a diamond product, a natural diamond and a synthetic diamond can be mentioned. Most of naturally occurring diamond single crystals belong to an Ia type, and contain around several hundreds to several thousands of ppm of nitrogen in a form of aggregating in a plate shape between lattices. In an Ia-type diamond single crystal, the content of impurities, the density and generation form of plate-like defects are varied even within the same crystal, and further the variation due to individual differences among crystals is large, therefore, the quality and performance are not stable. Moreover, among natural diamond single crystals, a high-purity product having less than or equal to several ppm of nitrogen impurities is called type IIa. The IIa-type diamond single crystal has extremely few impurities, but has many internal distortion and defects, therefore is not suitable for tool applications.

On the other hand, in synthetic diamonds, a synthetic diamond having a constant quality can be stably supplied. Therefore, synthetic diamonds are widely used in an industrial field.

SUMMARY OF INVENTION

Technical Problems

A synthetic diamond single crystal usually contains nitrogen as impurities, and it is known that the mechanical properties of diamond deteriorate as the nitrogen impurity concentration increases. For this reason, in a case where a synthetic diamond single crystal is applied to a wear-resistant tool or a diamond tool for cutting, there was a problem that performance such as tool life becomes low due to the progress of wear and the uneven wear.

Accordingly, an object of the present invention is to provide a diamond single crystal capable of improving mechanical properties of a tool, such as wear resistance, and defect resistance, and further improving tool life, in a case of being used for a tool; a tool; and a method for producing a diamond single crystal.

Solutions to Problems

[1] A diamond single crystal according to one embodiment of the present invention is a diamond single crystal containing nitrogen atoms, a concentration of the nitrogen atoms changes periodically along a crystal orientation of the diamond single crystal, and an arithmetic average value $A_{ave}$, a maximum value $A_{max}$, and a minimum value $A_{min}$ of a distance of one period along the crystal orientation satisfy the relationship expressed by the following equation (I):

$$(A_{max})/1.25 \leq (A_{ave}) \leq (A_{min})/0.75 \quad (I)$$

[2] A tool according to one embodiment of the present invention is a tool including the diamond single crystal of the above [1].

[3] A method for producing a diamond single crystal according to one embodiment of the present invention is a method for producing a diamond single crystal, including growing a diamond single crystal on a diamond seed crystal by a temperature difference method using a solvent metal, the content of nitride in the solvent metal during synthesis of the diamond single crystal is exceeding 0% by mass and less than 3% by mass, and the rate of temperature change in low-temperature part of the solvent metal is less than 1% of a predetermined temperature.

Advantageous Effects of Invention

According to the above embodiments, a diamond single crystal capable of improving mechanical properties of a tool, such as wear resistance, and defect resistance, and further improving tool life, in a case of being used for a tool, and a method for producing a diamond single crystal can be provided.

DESCRIPTION OF EMBODIMENTS

Figure 1:
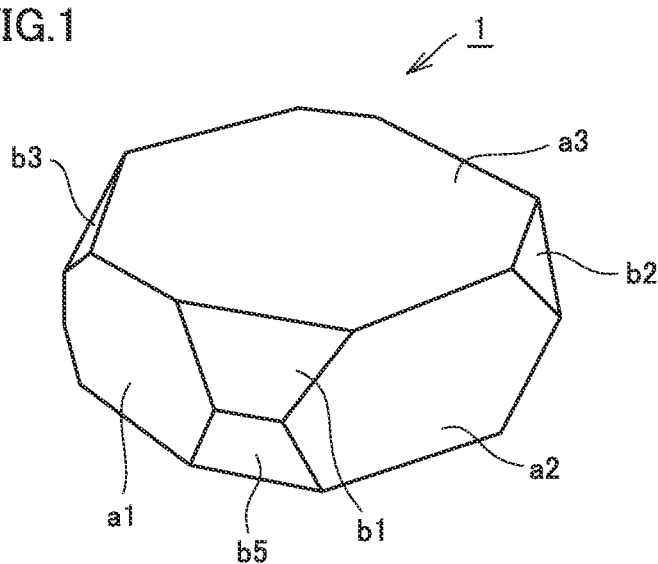
FIG. 1 is a perspective view of a diamond single crystal according to one embodiment of the present invention.

[Description of Embodiment of the Present Invention]

First, the embodiments of the present invention will be listed and described. In the present specification, an individual orientation is represented by [ ], a group orientation is represented by < >, and an individual plane is represented by ( ), and a group plane is represented by { }.

(1) A diamond single crystal according to one embodiment of the present invention is a diamond single crystal containing nitrogen atoms, in which a concentration of the nitrogen atoms changes periodically along a crystal orientation of the diamond single crystal, and an arithmetic average value $A_{ave}$, a maximum value $A_{max}$, and a minimum value $A_{min}$ of a distance of one period along the crystal orientation satisfy the relationship expressed by the following equation (I):

$$(A_{max})/1.25 \leq (A_{ave}) \leq (A_{min})/0.75 \qquad (I)$$

A diamond single crystal according to one embodiment of the present invention can improve the mechanical properties of a tool, such as wear resistance, and defect resistance, and further can improve the tool life, in a case of being used for a tool.

(2) An arithmetic average value $A_{ave}$ of one period is preferably greater than or equal to 1 μm and less than or equal to 50 μm. According to this, the wear resistance and defect resistance of the tool are improved.

(3) The diamond single crystal preferably contains nitrogen atoms in a concentration of greater than or equal to 10 ppm and less than or equal to 1000 ppm. When the nitrogen atom concentration in the diamond single crystal exceeds 1000 ppm, the characteristics of the diamond remarkably deteriorate. On the other hand, when the nitrogen atom concentration is less than 10 ppm, cracks tend to propagate and a sufficient crack propagation suppressing effect cannot be obtained.

(4) In the diamond single crystal, the full width at half maximum of a diamond phonon peak appearing at a Raman shift of 1332 $cm^{-1}$ in Raman spectroscopy is preferably greater than or equal to 2.2 $cm^{-1}$ and less than or equal to 3.6 $cm^{-1}$. When the full width at half maximum exceeds 3.6 $cm^{-1}$, the content of nitrogen impurities in the diamond single crystal is large and mechanical properties and thermal properties are lowered. On the other hand, when the full width at half maximum is less than 2.2 $cm^{-1}$, the content of nitrogen impurities in the diamond single crystal is small and the defect resistance is lowered.

(5) In the diamond single crystal, the absorption coefficient at a wave number of 1130 $cm^{-1}$ in infrared spectroscopy at a thickness of 1 mm is preferably greater than or equal to 0.5 $cm^{-1}$ and less than or equal to 44 $cm^{-1}$. According to this, the diamond single crystal can be suitably used as a tool material without largely impairing the thermal and mechanical properties of the diamond single crystal by the nitrogen impurities that are an isolated substitution type and have been introduced into the crystal.

(6) In the diamond single crystal, the lattice constant is preferably greater than or equal to 3.56712 Å and less than or equal to 3.56755 Å as measured by X-ray diffraction. When the lattice constant exceeds 3.56755 Å, the crystal strain becomes extremely large and the thermal and mechanical properties of the diamond single crystal are impaired.

(7) In the diamond single crystal, the cracking load is preferably greater than or equal to 5 N in a breaking strength test in which a diamond indenter having a tip radius of 50 μm is pressed against a surface of the diamond single crystal at a loading rate of 100 N/min. According to this, the diamond single crystal has excellent breaking strength, and the diamond single crystal can be suitably used as a tool material.

(8) In the diamond single crystal, the size is preferably greater than or equal to 0.2 carat. According to this, in a case where the diamond single crystal is used for a wear-resistant tool or a cutting tool, a cutting edge that becomes a sliding/cutting point of a tool can be fabricated by selecting a crystal orientation suitable for the application from the diamond single crystal, and a tool with better performance can be provided.

(9) In the diamond single crystal, the diamond single crystal has a crystal form forming {111} planes at greater than or equal to four corners among eight corners of a hexahedron formed of a set of {100} planes, and has a ratio β/α of an average value β of a plane distance between planes parallel to each other in greater than or equal to two sets in {111} plane to an average value α of a plane distance between planes parallel to each other in three sets in {100} plane of greater than or equal to 0.8 and less than or equal to 1.3. According to this, a cutting edge that becomes a sliding/cutting point of a tool can be efficiently fabricated from the diamond single crystal, and the production cost can be reduced.

(10) In the diamond single crystal, an inclusion containing: greater than or equal to one element selected from the group consisting of titanium (Ti), vanadium (V), chromium (Cr), manganese (Mn), iron (Fe), nickel (Ni), cobalt (Co), copper (Cu), zirconium (Zr), niobium (Nb), molybdenum (Mo), ruthenium (Ru), rhodium (Rh), palladium (Pd), hafnium (Hf), tantalum (Ta), tungsten (W), osmium (Os), iridium (Ir), and platinum (Pt); greater than or equal to one alloy containing greater than or equal to two elements of these elements; a compound of greater than or equal to one element selected from the group consisting of these elements and carbon (C) or oxygen (O); and at least one kind selected from the group consisting of complexes of the compound, is included, and a content density of the inclusion is preferably less than or equal to 20 pieces/$mm^3$. According to this, when the diamond single crystal is bonded to a polishing substrate, breakage of the diamond single crystal due to the thermal expansion difference between the diamond single crystal and the substrate can be prevented.

(11) In the diamond single crystal, an inclusion containing: greater than or equal to one element selected from the group consisting of titanium (Ti), vanadium (V), chromium (Cr), manganese (Mn), iron (Fe), nickel (Ni), cobalt (Co), copper (Cu), zirconium (Zr), niobium (Nb), molybdenum (Mo), ruthenium (Ru), rhodium (Rh), palladium (Pd), hafnium (Hf), tantalum (Ta), tungsten (W), osmium (Os), iridium (Ir), and platinum (Pt); greater than or equal to one alloy containing greater than or equal to two elements of these elements; a compound of greater than or equal to one element selected from the group consisting of these elements and carbon (C) or oxygen (O); and at least one kind selected from the group consisting of complexes of the compound, is included, and the inclusion preferably has a maximum value of the diameter of less than or equal to 10 μm. According to this, when the diamond single crystal is bonded to a polishing substrate, breakage of the diamond single crystal due to the thermal expansion difference between the diamond single crystal and the substrate can be prevented.

(12) A tool according to one embodiment of the present invention is a tool including the diamond single crystal according to any one of the above (1) to (11). The tool according to one embodiment of the present invention has excellent wear resistance and defect resistance, and is excellent in the tool life.

(13) A method for producing a diamond single crystal according to one embodiment of the present invention is a method for producing a diamond single crystal, including growing a diamond single crystal on a diamond seed crystal by a temperature difference method using a solvent metal, the content of nitride in the solvent metal during synthesis of the diamond single crystal is exceeding 0% by mass and less than 3% by mass, and the rate of temperature change in low-temperature part of the solvent metal is less than 1% of the predetermined temperature. According to this, a diamond single crystal having excellent wear resistance and defect resistance can be obtained. As a method for introducing nitride into a solvent metal during synthesis, a method for adding nitride into a carbon source may be used in addition to a method for adding nitride into a solvent metal.

[Details of Embodiment of the Present Invention]

Specific examples of the diamond single crystal, the tool, and the method for producing a diamond single crystal according to the embodiments of the present invention will be described below with reference to drawings. In the drawings of the present invention, the same reference numerals denote the same parts or corresponding parts. In addition, dimensional relation of length, width, thickness, and depth is appropriately changed for clarification and simplification of the drawings, and does not represent the actual dimensional relation. The present invention is not limited to these examples but is intended to be indicated by the scope of the claims, and include all modifications within the scope and meaning equivalent to the claims.

[Diamond Single Crystal]

The diamond single crystal according to one embodiment of the present invention will be described with reference to FIGS. 1, 2A, 2B, and 3 to 4.

The diamond single crystal has a crystal form forming {111} planes at greater than or equal to four corners among eight corners of a hexahedron formed of a set of {100} planes. Specifically, as shown in FIG. 1, a diamond single crystal 1 has a shape in which eight corners of a hexahedron formed of a set of {100} planes including the planes indicated by the reference signs a1, a2, and a3 and three planes parallel to the respective planes are cut off by {111} planes including the planes indicated by the reference signs b1, b2, b3, and b5. In diamond single crystal 1 shown in FIG. 1, {111} planes are formed at eight corners of a hexahedron, but the number of corners at which {111} planes are formed is not particularly limited as long as being greater than or equal to four.

The diamond single crystal contains nitrogen atoms, and the concentration of the nitrogen atoms changes periodically along the crystal orientation of the diamond single crystal. The expression "concentration of the nitrogen atoms changes periodically along the crystal orientation of the diamond single crystal" means that the nitrogen concentration periodically repeats the increase and decrease by perturbation along the orientation of the crystal plane forming the outer shape of the diamond single crystal.

It is known that the hardness and strength of a crystal are different depending on the amount of the nitrogen impurities incorporated in the diamond single crystal. In association with the change in the nitrogen amount in a microscopic region in the diamond single crystal, the mechanical properties of the crystal also change in the microscopic region. When a diamond single crystal is used as a tool, by the change in the mechanical properties in the diamond single crystal, the propagation direction of the chipping, cracks, and the like generated in a sliding part or a cutting edge is changed, therefore, the propagation of the chipping and cracks can be suppressed.

In the diamond single crystal of the present embodiment, since the concentration of nitrogen atoms changes along the crystal orientation of the diamond single crystal, the mechanical properties of the crystal also change in a microscopic region. Therefore, when the diamond single crystal of the present embodiment is used for a tool material, the effect of suppressing the propagation of chipping and cracks is high, and the defect resistance and wear resistance of the tool are improved.

It can be confirmed by using an optical microscope with high magnification of greater than or equal to 50 times, or a fluorescence microscope for observing fluorescence generated by the irradiation with UV rays that the nitrogen concentration changes periodically along the crystal orientation in the diamond single crystal. Specifically, in a case where the nitrogen concentration changes periodically along the crystal orientation in the diamond single crystal, it can be confirmed that a layer structure parallel to the crystal plane in the diamond single crystal is periodically present along the crystal orientation.

Figure 2A:
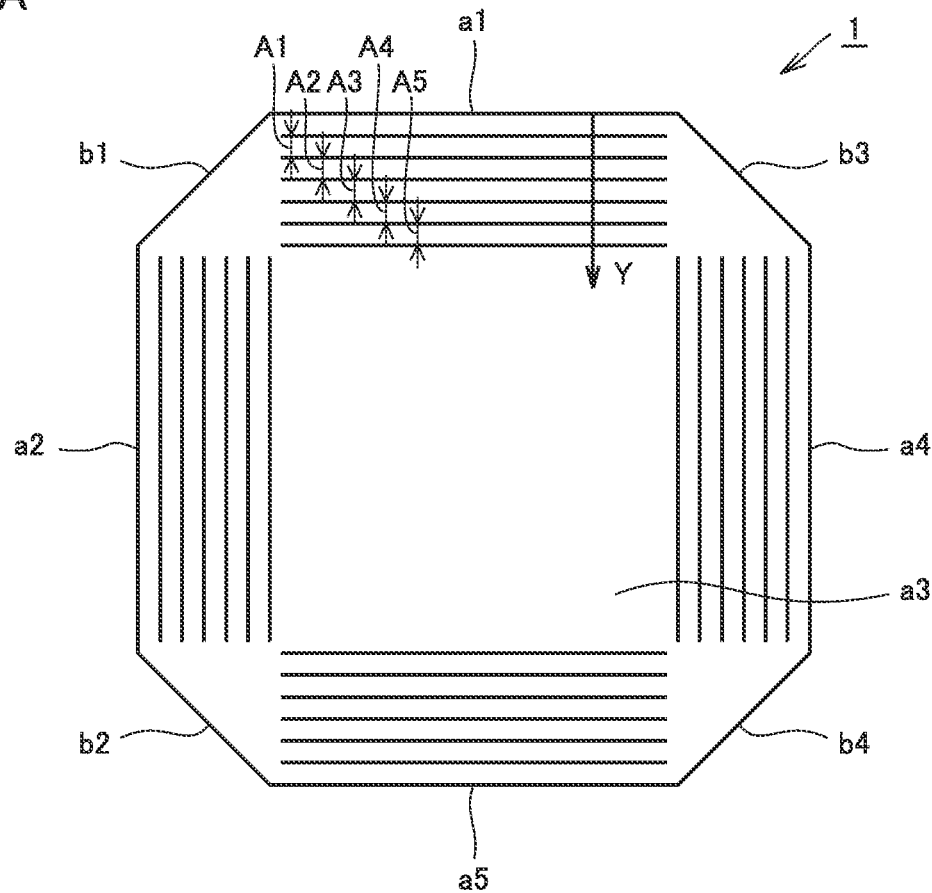
FIG. 2A is a schematic top view of the diamond single crystal shown in FIG. 1.
Figure 2B:
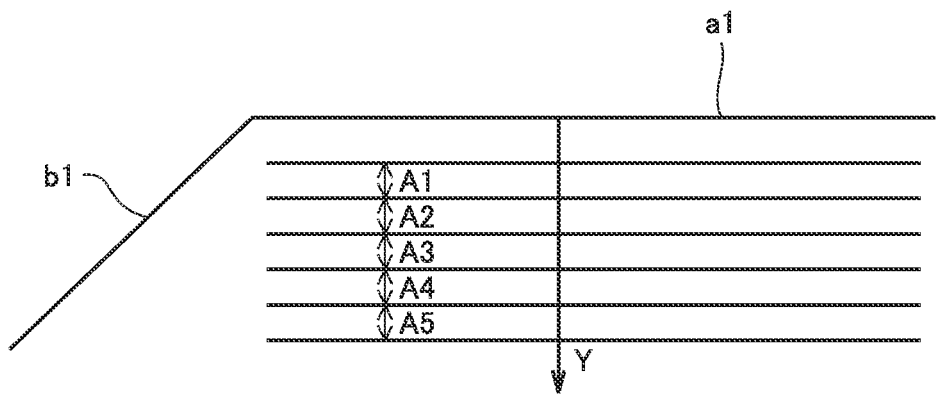
FIG. 2B is an enlarged schematic view of a part of FIG. 2A.

FIG. 2A is a schematic view of an observation image in a case where diamond single crystal 1 shown in FIG. 1 is observed with an optical microscope from the upper side of the plane indicated by the reference sign a3. FIG. 2B is an enlarged schematic view of a part of diamond single crystal 1 shown in FIG. 2A. When the nitrogen concentration changes periodically along the crystal orientation in the diamond single crystal, as shown in FIGS. 2A and 2B, a line substantially parallel to the {100} plane constituting the outer shape of the diamond single crystal is periodically observed along the <100> orientation indicated by the arrow Y. The line substantially parallel to the {100} plane shows a place where the concentration of the nitrogen contained in the crystal is higher than that of the surroundings. Therefore, the fact that the line substantially parallel to the {100} plane is periodically present along the <100> orientation of the crystal indicates that the nitrogen concentration in the crystal periodically changes along the <100> orientation, and a periodic layer structure is present in the crystal. Further, the change in the nitrogen concentration in the diamond single crystal can be confirmed by the full width at half maximum of the Raman peak of microscopic Raman spectroscopy, or the difference in absorption coefficient at 1130 $cm^{-1}$ in microscopic infrared spectroscopy.

In the diamond single crystal of the present embodiment, the nitrogen atom concentration changes periodically along the crystal orientation of the diamond single crystal, and an arithmetic average value $A_{ave}$, a maximum value $A_{max}$, and a minimum value $A_{min}$ of the distance of one period along the crystal orientation satisfy the relationship expressed by the following equation (I):

$$(A_{max})/1.25 \leq (A_{ave}) \leq (A_{min})/0.75 \tag{I}$$

The expression "distance of one period along the crystal orientation" means each of the distances A1, A2, A3, A4 and A5 between lines of the multiple lines substantially parallel to the {100} plane, periodically observed along the <100> orientation, for example, existing in a (100) growth sector. Herein, the (100) growth sector is mentioned, but the expression "distance of one period along the crystal orientation" is not limited to this, and is defined to include also the distance between the lines parallel to the crystal plane periodically observed, contained in other crystal growth sectors. In FIGS. 2A and 2B, six lines substantially parallel to the {100} plane are drawn, but the number of lines substantially parallel to the {100} plane is not limited to six, and is not particularly limited as long as being greater than or equal to multiple lines.

The arithmetic average value $A_{ave}$ of the distance of one period, for example, in a case where the number of lines substantially parallel to the {100} plane is N (N≥3), can be determined by the following equation (II).

$$(A_{ave}) = (A1 + A2 + \ldots + A(N-1))/(N-1) \tag{II}$$

The maximum value $A_{max}$ of the distance of one period is a value of the longest distance among the distances A1, A2, A3, ..., AN between lines of the multiple lines substantially parallel to the {100} plane. The minimum value $A_{min}$ of the distance of one period is a value of the shortest distance among the distances A1, A2, A3, ..., AN between lines of the multiple lines substantially parallel to the {100} plane. When the arithmetic average value $A_{ave}$, maximum value $A_{max}$, and minimum value $A_{min}$ of the distance of one period satisfy the relationship of the above equation (I), in a case where the diamond single crystal is used as a tool, the propagation of chipping and cracks can be effectively suppressed.

The arithmetic average value $A_{ave}$ of the distance of one period is preferably greater than or equal to 1 μm and less than or equal to 50 μm. According to this, the propagation of chipping and cracks can be effectively suppressed, and the wear resistance and defect resistance of the tool are improved. In a case where the diamond single crystal is applied to high-precision processing as a small diameter wire drawing die, an orifice for water jet, and a precision cutting tool, the arithmetic average value $A_{ave}$ of the distance of one period is preferably as small as possible, and preferably greater than or equal to 1 μm and less than or equal to 5 μm.

The diamond single crystal according to the present embodiment contains preferably nitrogen atoms at a concentration of greater than or equal to 10 ppm and less than or equal to 1000 ppm. The concentration of nitrogen atoms in the diamond single crystal can be measured by secondary ion mass spectrometry (SIMS). When the diamond single crystal contains nitrogen atoms in an amount of exceeding 1000 ppm, the characteristics of diamond are remarkably impaired. On the other hand, when the nitrogen atom concentration is less than 10 ppm, cracks are easily propagated and a sufficient crack propagation suppressing effect cannot be obtained. The concentration of nitrogen atoms in the diamond single crystal is more preferably greater than or equal to 10 ppm and less than or equal to 800 ppm, furthermore preferably greater than or equal to 10 ppm and less than or equal to 600 ppm, and still more preferably greater than or equal to 10 ppm and less than or equal to 300 ppm.

In the diamond single crystal according to the present embodiment, the full width at half maximum of the diamond phonon peak appearing at a Raman shift of 1332 cm$^{-1}$ in Raman spectroscopy is preferably greater than or equal to 2.2 cm$^{-1}$ and less than or equal to 3.6 cm$^{-1}$. When a diamond single crystal contains a large amount of impurities or defects, the crystallinity is lowered, therefore, the excellent thermal or mechanical properties inherent in diamond are suppressed. The crystallinity of diamond is better as the diamond phonon peak appearing at a Raman shift of 1332 cm$^{-1}$ in Raman spectroscopy is sharper, and the full width at half maximum of the diamond phonon peak is increased as the crystallinity is lowered. When the full width at half maximum of the diamond phonon peak appearing at a Raman shift of 1332 cm$^{-1}$ is less than or equal to 3.6 cm$^{-1}$, the mechanical and thermal properties of the crystal are not impaired due to the lowering in crystallinity by the addition of nitrogen. On the other hand, in a diamond single crystal having a low amount of the impurities such as nitrogen and having extremely high crystallinity, the effect of the periodic structure is not exerted, and the crack propagation characteristics become excessively high, as a result, the tool performance may be impaired. Therefore, the full width at half maximum of the diamond phonon peak appearing at a Raman shift of 1332 cm$^{-1}$ is preferably greater than or equal to 2.2 cm$^{-1}$.

In the diamond single crystal according to the present embodiment, the absorption coefficient at a wave number of 1130 cm$^{-1}$ in infrared spectroscopy is preferably greater than or equal to 0.5 cm$^{-1}$ and less than or equal to 44 cm$^{-1}$. In a case where nitrogen atoms are introduced as an isolated substitution type in a diamond crystal, absorption may be present at 1130 cm$^{-1}$ as the absorption measurement is performed. In the case of performing the absorption measurement by a transmission method, a method for correcting the sample thickness theoretically from Lambert-Beer absorption law is known, but in order to obtain accurate absorption coefficients between materials having largely different absorbances even in the same substances, it is required to make the thickness of samples uniform and then to perform the measurement. Further, in a case of discussing the absorption by impurities and/or defects in the infrared region of a diamond single crystal, relative comparison with the absorption by two phonons inherent in diamond becomes important. When the sample is excessively thick, the absorption by two phonons in the spectrum is saturated, and the accurate comparison cannot be performed, therefore, it is required to measure the sample with an appropriate sample thickness.

In the diamond single crystal according to the present embodiment, as long as the absorption coefficient at a wave number of 1130 cm$^{-1}$ in infrared spectroscopy is greater than or equal to 0.5 cm$^{-1}$ and less than or equal to 44 cm$^{-1}$, the diamond single crystal can be suitably used as a tool material without largely impairing the thermal and mechanical properties of the diamond by the nitrogen that is an isolated substitution type and has been introduced into the crystal. The absorption coefficient is preferably less than or equal to 36 cm$^{-1}$, more preferably less than or equal to 27 cm$^{-1}$, and furthermore preferably less than or equal to 14 cm$^{-1}$.

In the diamond single crystal according to the present embodiment, as long as the lattice constant is greater than or equal to 3.56712 Å and less than or equal to 3.56755 Å, the diamond single crystal can be suitably used as a tool material without increasing the crystal strain and further impairing the thermal and mechanical properties of the diamond single crystal.

In the diamond single crystal according to the present embodiment, the cracking load is preferably greater than or equal to 5 N in a breaking strength test in which a diamond indenter having a tip radius R of 50 μm is pressed against a surface of the diamond single crystal at a loading rate of 100 N/min. According to this, the diamond single crystal has excellent breaking strength, and the diamond single crystal can be suitably used as a tool material.

A specific method of the breaking strength test is as follows. First, a diamond indenter having a tip radius R of 50 μm is applied to a sample, and a load is applied to the indenter at a rate of 100 N/min, and the load (cracking load) at the moment when cracks occurred in the sample is measured. The moment when the cracks occur is measured with an AE sensor. It is indicated that the larger the cracking load is, the higher the strength of the diamond single crystal is. When an indenter having a tip radius R of smaller than 50 μm is used as a measurement indenter, the sample is plastically deformed before occurrence of cracks, and the accurate strength to cracks cannot be measured. In addition, although the measurement can be performed even by using an indenter having a tip radius R of larger than 50 μm, the load required until cracks occur is increased, further the contact area between the indenter and the sample becomes large, and there is a problem that the influence on the measurement accuracy due to the surface precision of the sample, the influence of the crystal orientation of the single crystal, and the like become remarkable. Accordingly, it is desired to use an indenter having a tip radius R of 50 μm in the breaking strength test of a diamond single crystal.

The diamond single crystal according to the present embodiment has preferably a size of greater than or equal to 0.2 carat (ct). According to this, in a case where the diamond single crystal is used for a wear-resistant tool or a cutting tool, a cutting edge that becomes a sliding/cutting point of a tool can be efficiently fabricated from the diamond single crystal, and the production cost can be reduced. The diamond single crystal has more preferably a size of greater than or equal to 0.74 carat.

The diamond single crystal according to the present embodiment has a crystal form forming {111} planes at greater than or equal to four corners among eight corners of a hexahedron formed of a set of {100} planes, and has a ratio β/α of an average value β of a plane distance between planes parallel to each other in greater than or equal to two sets in {111} plane to an average value α of a plane distance between planes parallel to each other in three sets in {100} plane of preferably greater than or equal to 0.8 and less than or equal to 1.3. According to this, in a case where the diamond single crystal is used for a wear-resistant tool or a cutting tool, a cutting edge that becomes a sliding/cutting point of a tool can be efficiently fabricated from the diamond single crystal, and the production cost can be reduced. The ratio β/α of the average value α of the plane distance to the average value β of the plane distance is more preferably greater than or equal to 0.9 and less than or equal to 1.2.

Figure 3:
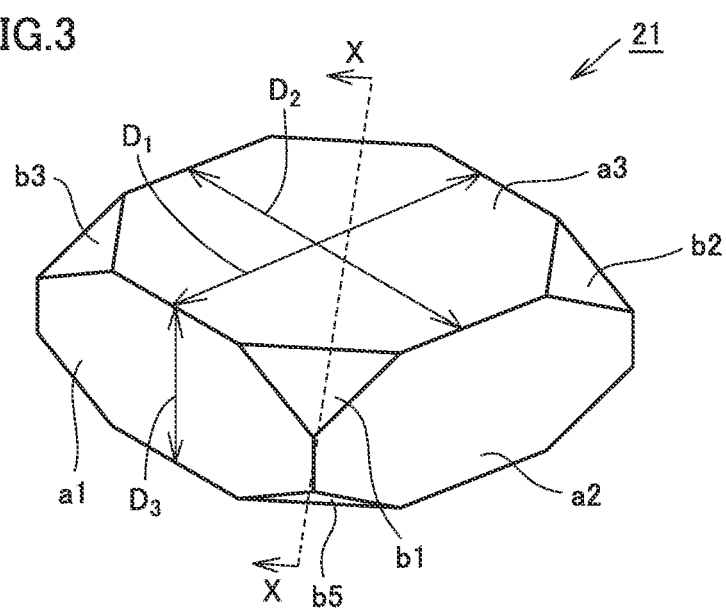
FIG. 3 is a perspective view of a diamond single crystal according to one embodiment of the present invention.
Figure 4:
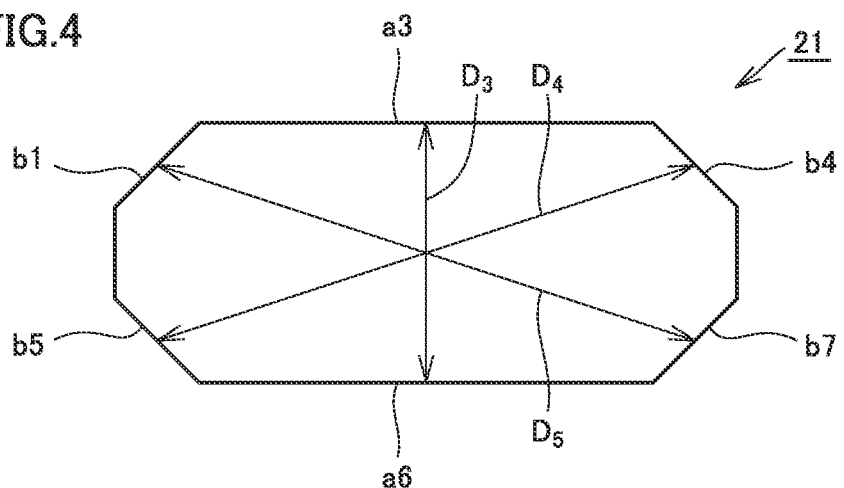
FIG. 4 is an X-X sectional view of the diamond single crystal shown in FIG. 3.

FIG. 3 shows a diamond single crystal 21 having a crystal form forming {111} planes at eight corners of a hexahedron formed of a set of {100} planes. FIG. 4 is a sectional view of the diamond single crystal shown in FIG. 3 cut along the line X-X. In diamond single crystal 21, the average value α of a plane distance between the planes parallel to each other in three sets in {100} plane means an arithmetic average value of a distance $D_1$ between the plane represented by the reference sign a1 and the plane parallel to the plane a1, a distance $D_2$ between the plane represented by the reference sign a2 and the plane parallel to the plane a2, and a distance $D_3$ between the plane represented by the reference sign a3 and the plane represented by the reference sign a6 parallel to the plane a3. The average value β of a plane distance between the planes parallel to each other in greater than or equal to two sets in {111} plane means an arithmetic average value of a distance $D_5$ between the plane represented by the reference sign b1 and the plane represented by the reference sign b7 parallel to the plane b1, a distance $D_6$ between the plane represented by the reference sign b2 and the plane parallel to the plane b2 (not shown), a distance $D_7$ between the plane represented by the reference sign b3 and the plane parallel to the plane b3 (not shown), and a distance $D_4$ between the plane represented by the reference sign b4 and the plane represented by the reference sign b5 parallel to the plane b4.

In diamond single crystal 21 shown in FIG. 3, since {111} planes are formed at eight corners of a hexahedron, there are four sets of the planes parallel to each other in the {111} plane. Accordingly, the average value β of the plane distance means an average value of four plane distances of $D_4$, $D_5$, $D_6$, and $D_7$. In a case where a {111} plane is formed at each of the six corners of a hexahedron, there are three sets of the planes parallel to each other, and the average value β of the plane distance means an average value of three plane distances. In a case where a {111} plane is formed at each of the four corners of a hexahedron, there are two sets of the planes parallel to each other, and the average value β of the plane distance means an average value of two plane distances.

In the diamond single crystal according to the present embodiment, an inclusion containing: greater than or equal to one element selected from the group consisting of titanium (Ti), vanadium (V), chromium (Cr), manganese (Mn), iron (Fe), nickel (Ni), cobalt (Co), copper (Cu), zirconium (Zr), niobium (Nb), molybdenum (Mo), ruthenium (Ru), rhodium (Rh), palladium (Pd), hafnium (Hf), tantalum (Ta), tungsten (W), osmium (Os), iridium (Ir), and platinum (Pt); greater than or equal to one alloy containing greater than or equal to two elements of these elements; a compound of greater than or equal to one element selected from the group consisting of these elements and carbon (C) or oxygen (O); and at least one kind selected from the group consisting of complexes of the compound, is included, and a content density of the inclusion is preferably less than or equal to 20 pieces/mm$^3$.

In the diamond single crystal according to the present embodiment, an inclusion containing: greater than or equal to one element selected from the group consisting of titanium (Ti), vanadium (V), chromium (Cr), manganese (Mn), iron (Fe), nickel (Ni), cobalt (Co), copper (Cu), zirconium (Zr), niobium (Nb), molybdenum (Mo), ruthenium (Ru), rhodium (Rh), palladium (Pd), hafnium (Hf), tantalum (Ta), tungsten (W), osmium (Os), iridium (Ir), and platinum (Pt); greater than or equal to one alloy containing greater than or equal to two elements of these elements; a compound of greater than or equal to one element selected from the group consisting of these elements and carbon (C) or oxygen (O); and at least one kind selected from the group consisting of complexes of the compound, is included, and the inclusion has preferably a maximum value of the diameter of less than or equal to 10 The diameter means the maximum length of a straight line that can be drawn in a single crystal having a certain size and a certain shape.

In a synthesis method for growing diamond crystals in a solvent metal, a simple substance of a solvent metal or a metal (Ti, V, Cr, Mn, Fe, Ni, Co, Cu, Zr, Nb, Mo, Ru, Rh, Pd, Hf, Ta, W, Os, Ir, Pt, and the like) contained in the solvent metal, an alloy, and further a carbide or oxide of these substances may be included in a crystal. In a case where the content density and size of the inclusion is large, when the diamond single crystal is bonded to a polishing substrate, the diamond single crystal may be broken due to the thermal expansion difference between the diamond single crystal and the polishing substrate, accordingly, there is a practical problem. It is preferred that a diamond single crystal does not include an inclusion having a size of greater than or equal to 10 μm. The content density of the inclusion in a diamond single crystal is preferably less than or equal to 20 pieces/mm$^3$, and more preferably a diamond single crystal does not substantially include any inclusion in the crystal.

[Tool]

The diamond single crystal according to one embodiment of the present invention is excellent in the defect resistance and the wear resistance, has low variation in the performance in the crystal and stable quality, and can be applied to various applications. The diamond single crystal can be used as a material for a wear-resistant tool or cutting tool such as a dresser, a wire drawing die, a scribe tool, and an orifice for water jet. A tool containing the diamond single crystal according to one embodiment of the present invention can perform the processing stably for a long time and has an excellent tool life, as compared with a tool fabricated from a conventional synthetic diamond single crystal, a natural diamond single crystal, or a diamond sintered material.

[Method for Producing Diamond Single Crystal]

Figure 5:
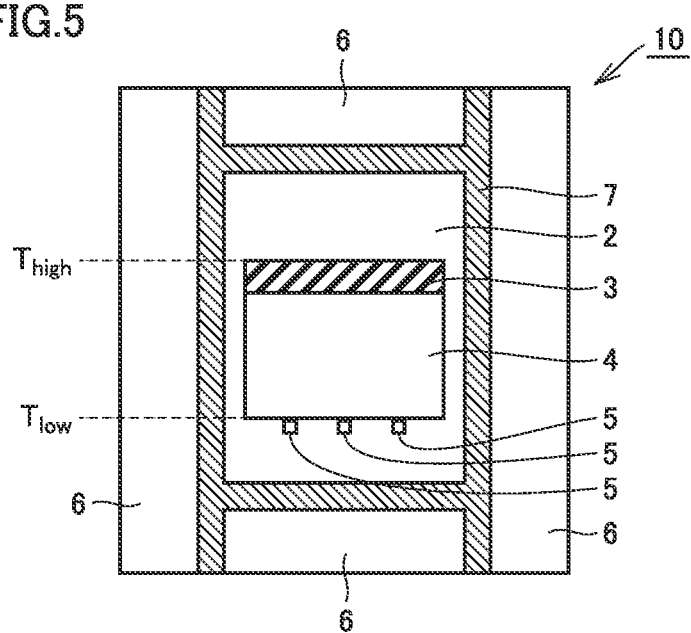
FIG. 5 is a schematic sectional view showing one example of a sample chamber configuration used for production of a diamond single crystal.

The diamond single crystal according to one embodiment of the present invention can be produced, for example, by a temperature difference method using a sample chamber having a configuration shown in FIG. 5.

As shown in FIG. 5, in a sample chamber 10 used for the production of the diamond single crystal according to the present embodiment, an insulator 2, a carbon source 3, a solvent metal 4, and seed crystals 5 are arranged in the space surrounded by a graphite heater 7, and a pressure medium 6 is arranged in the outside of graphite heater 7. The temperature difference method is a synthesis method in which a temperature gradient in the vertical direction is provided inside of sample chamber 10, carbon source 3 is arranged in the high-temperature part $T_{high}$ and seed crystals 5 are arranged in the low-temperature part $T_{low}$, solvent metal 4 is arranged between carbon source 3 and seed crystals 5, and a diamond single crystal is grown on each of seed crystals 5 while maintaining the conditions of a temperature greater than or equal to the temperature at which solvent metal 4 is dissolved and of a pressure greater than or equal to the pressure at which diamond is thermally stabilized.

As carbon source 3, diamond powder is preferably used.

As solvent metal 4, greater than or equal to one kind of a metal selected from iron (Fe), cobalt (Co), nickel (Ni), manganese (Mn), and the like, or an alloy containing these metals can be used. Solvent metal 4 may further contain a simple substance of aluminum nitride (AlN), iron nitride ($Fe_2N$, and $Fe_3N$), and silicon nitride ($Si_3N_4$), or a mixed powder thereof. Furthermore, an inorganic nitrogen compound such as copper nitride (CuN), iron nitride ($Fe_2N$, and $Fe_3N$), and titanium nitride (TiN), and an organic nitrogen compound such as melamine, and sodium azide may be added as a simple substance or a mixture thereof. Solvent metal 4 may further contain greater than or equal to one element selected from the group consisting of titanium (Ti), vanadium (V), chromium (Cr), manganese (Mn), copper (Cu), zirconium (Zr), niobium (Nb), molybdenum (Mo), ruthenium (Ru), rhodium (Rh), hafnium (Hf), tantalum (Ta), tungsten (W), osmium (Os), iridium (Ir), and platinum (Pt).

The content of nitride in solvent metal 4 is exceeding 0% by mass and less than 3% by mass. According to this, in a case where a crystal is synthesized under the conditions detailed below, an effect that nitrogen is incorporated into the diamond crystal with periodicity can be obtained.

In the synthesis of the diamond single crystal, the rate of temperature change in the low-temperature part of the solvent metal is less than 1% of the predetermined temperature. Herein, the temperature in the low-temperature part of solvent metal 4 means a temperature of solvent metal 4 in the vicinity of seed crystal 5 (part indicated by $T_{low}$ in FIG. 5). The predetermined temperature means a control temperature in the low-temperature part of solvent metal 4. For example, in a case where the temperature in the low-temperature part of the solvent metal is controlled to 1300° C., 1300° C. is the predetermined temperature, and 1% of the predetermined temperature is 13° C. Therefore, in this case, the temperature in the low-temperature part of the solvent metal is in the range of 1300° C.±13° C., that is, it is required to control the temperature in the range of higher than 1287° C. and less than 1313° C. As described above, by controlling the rate of temperature change in the low-temperature part of the solvent metal to less than 1% of the predetermined temperature, nitrogen is incorporated with periodicity in a diamond single crystal due to a natural perturbation effect by fluctuation, and a layer structure having a periodicity is formed in the diamond single crystal.

EXAMPLES

The present invention will be described in more detail by way of examples. However, the present invention should not be limited to the following examples.

<Synthesis of Diamond Single Crystal>

[Sample 1]

Synthesis of a diamond single crystal was performed by a temperature difference method using a sample chamber having a configuration shown in FIG. 5.

The solvent metal was prepared by using an alloy including iron-cobalt-nickel, and by adding 0.01 part by weight of a mixed powder of aluminum nitride (AlN), iron nitride ($Fe_2N$, and $Fe_3N$), and silicon nitride ($Si_3N_4$) based on 100 parts by weight of the alloy.

As the carbon source, diamond powder was used, and as the seed crystal, a diamond single crystal with around 0.5 mg was used. The temperature in a sample chamber was adjusted by a heating heater so as to obtain a temperature difference of several tens of degrees between the high-temperature part arranged with a carbon source and the low-temperature part arranged with a seed crystal. In addition to this, by using a ultra-high pressure generator, the pressure was controlled to 5.5 GPa, the temperature in the low-temperature part was controlled in the range of 1370° C.±10° C. (1360° C. to 1380° C.), and the controlled pressure and temperature were kept for 60 hours, and a diamond single crystal was synthesized on the seed crystal.

[Samples 2 to 12]

A diamond single crystal was synthesized in the similar manner as in Sample 1 except that the raw material composition of the solvent metal, and the temperature and the control range in the low-temperature part were changed to the numerical values shown in Table 1.

TABLE 1

|  |  |  | Sample 1 | Sample 2 | Sample 3 | Sample 4 | Sample 5 | Sample 6 |
|---|---|---|---|---|---|---|---|---|
| Syn-thesis con-dition | Solvent (parts by weight) | Fe—Co—Ni based alloy | 100 | 100 | 100 | 100 | 100 | 100 |
|  |  | AlN, FeN, and SiN mixed powder | 0.010 | 0.050 | 0.020 | 0.100 | 0.005 | 1.000 |
|  | Low-temperature part temperature (° C.) |  | 1370 | 1390 | 1370 | 1370 | 1370 | 1370 |
|  | Control range of (° C.) |  | ±10 | ±10 | ±10 | ±10 | ±7 | ±12 |
|  | low-temperature part (%) temperature |  | 0.74 | 0.72 | 0.73 | 0.73 | 0.51 | 0.88 |
|  | Synthesis time (hours) |  | 60 | 50 | 60 | 60 | 60 | 60 |

TABLE 1-continued

| | | | | | | | | |
|---|---|---|---|---|---|---|---|---|
| Diamond single crystal | | Crystal form | Hexa-octahedral crystal | Hexa-octahedral crystal | Hexa-octahedral crystal | Hexa-octahedral crystal | Hexa-octahedral crystal | Hexa-octahedral crystal |
| | Periodic structure | Presence or absence | Presence | Presence | Presence | Presence | Presence | Presence |
| | | Arithmetic average value (Aave) (μm) | 10.0 | 10.0 | 5.0 | 10.0 | 30.0 | 10.0 |
| | | Maximum value (Amax) (μm) | 12.0 | 11.0 | 6.0 | 12.5 | 35.0 | 12.5 |
| | | Minimum value (Amin) (μm) | 9.75 | 7.50 | 3.80 | 8.00 | 25.00 | 8.00 |
| | Ratio of plane distance | (β/α) | 1.2 | 1.1 | 1.0 | 0.9 | 1.3 | 0.8 |
| | Inclusion | Presence or absence | Absence | Absence | Absence | Presence | Absence | Presence |
| | | Maximum value of diameter (μm) | — | — | — | 5 | — | 10 |
| | | Number of inclusion (pieces/cm$^3$) | — | — | — | 5 | — | 3 |
| | Nitrogen concentration | (ppm) | 100 | 300 | 550 | 800 | 30 | 1200 |
| | Raman spectroscopy | Full width at half maximum (cm$^{-1}$) | 2.8 | 3.2 | 3.4 | 3.5 | 2.4 | 3.6 |
| | Infrared spectroscopy | Absorption coefficient (cm$^{-1}$) | 4.5 | 13.0 | 24.0 | 35.0 | 1.5 | 53.0 |
| | Lattice constant measurement | Lattice constant (Å) | 3.56716 | 3.56725 | 3.56736 | 3.56746 | 3.56713 | 3.56763 |
| Tool | Breaking strength test | Cracking load (N) | 8 | 8 | 8 | 8 | 10 | 6 |
| | | Crystal size used in fabrication (ct) | 1.00 | 0.75 | 0.80 | 1.00 | 1.00 | 1.00 |
| | Dresser | Tool life (index) | 1.20 | 1.15 | 1.10 | 1.10 | 1.00 | 1.00 |
| | Wire drawing die | Tool life (index) | 1.30 | 1.20 | 1.20 | 1.00 | 1.00 | 1.00 |
| | Scribe tool | Wear resistance (index) | 1.30 | 1.30 | 1.20 | 1.15 | 1.15 | 1.00 |
| | Cutting tool | Tool life (index) | 1.40 | 1.20 | 1.20 | 1.10 | 1.00 | 1.00 |
| | Scribe wheel | Tool life (index) | 1.40 | 1.30 | 1.20 | 1.20 | 1.15 | 1.00 |
| | Water jet orifice | Tool life (index) | 1.30 | 1.30 | 1.20 | 1.20 | 1.15 | 1.00 |

| | | | Sample 7 | Sample 8 | Sample 9 | Sample 10 | Sample 11 | Sample 12 |
|---|---|---|---|---|---|---|---|---|
| Synthesis condition | Solvent (parts by weight) | Fe—Co—Ni based alloy | 100 | 100 | 100 | 100 | 100 | 100 |
| | | AlN, FeN, and SiN mixed powder | 0.020 | 0.005 | 4.000 | 0.010 | 0.000 | 0.010 |
| | Low-temperature part temperature (° C.) | | 1390 | 1390 | 1360 | 1450 | 1330 | 1370 |
| | Control range of low-temperature part temperature | (° C.) (%) | ±13 0.94 | ±13 0.94 | ±10 0.51 | ±25 1.72 | ±10 0.75 | ±10 0.74 |
| | Synthesis time (hours) | | 60 | 60 | 35 | 90 | 80 | 20 |
| Diamond single crystal | | Crystal form | Hexa-octahedral crystal | Hexa-octahedral crystal | Hexa-octahedral crystal | Hexa-octahedral crystal | Hexa-octahedral crystal | Hexa-octahedral crystal |
| | Periodic structure | Presence or absence | Presence | Presence | Presence | Presence | Absence | Presence |
| | | Arithmetic average value (Aave) (μm) | 100.0 | 0.5 | 10.0 | 25.0 | — | 10.0 |
| | | Maximum value (Amax) (μm) | 120.0 | 0.7 | 50.0 | 50.0 | — | 12.0 |
| | | Minimum value (Amin) (μm) | 75.00 | 0.30 | 5.00 | 13.00 | — | 9.75 |
| | Ratio of plane distance | (β/α) | 1.1 | 1.1 | 1.3 | 0.6 | 1.5 | 1.2 |
| | Inclusion | Presence or absence | Absence | Absence | Absence | Absence | Presence | Absence |
| | | Maximum value of diameter (μm) | — | — | — | — | 30 | — |
| | | Number of inclusion (pieces/cm$^3$) | — | — | — | — | 25 | — |
| | Nitrogen concentration | (ppm) | 100 | 100 | 2000 | 200 | 5 | 100 |
| | Raman spectroscopy | Full width at half maximum (cm$^{-1}$) | 2.8 | 2.6 | 4.0 | 3.0 | 2.0 | 2.8 |
| | Infrared spectroscopy | Absorption coefficient (cm$^{-1}$) | 4.5 | 4.5 | 88.0 | 8.8 | 0.2 | 4.5 |
| | Lattice constant measurement | Lattice constant (Å) | 3.56716 | 3.56716 | 3.56798 | 3.56720 | 3.56712 | 3.56716 |
| Tool | Breaking strength test | Cracking load (N) | 5 | 5 | 3 | 4 | 4 | 8 |
| | | Crystal size used in fabrication (ct) | 1.00 | 1.00 | 0.50 | 2.50 | 2.00 | 0.15 |
| | Dresser | Tool life (index) | 0.60 | 0.80 | 0.50 | 0.40 | 0.50 | Not fabricated |
| | Wire drawing die | Tool life (index) | 0.70 | 0.50 | 0.40 | 0.40 | 0.40 | 1.20 |
| | Scribe tool | Wear resistance (index) | 0.40 | 0.40 | 0.20 | 0.30 | 0.30 | Not fabricated |
| | Cutting tool | Tool life (index) | 0.30 | 0.40 | 0.20 | 0.20 | 0.30 | Not fabricated |
| | Scribe wheel | Tool life (index) | 0.50 | 0.50 | Not fabricated | 0.30 | Not evaluated | Not fabricated |
| | Water jet orifice | Tool life (index) | 0.40 | 0.30 | 0.20 | 0.20 | Not evaluated | Not fabricated |

<Evaluation of Diamond Single Crystal>

For the obtained single-crystal diamonds, observation of the crystal, observation of the inclusion, measurement of the nitrogen concentration, Raman spectroscopy, infrared spectroscopy, lattice constant measurement, and breaking strength tests were performed.

(Observation of Crystal)

Each of the diamond single crystals in Samples 1 to 11 had around 0.5 to 2.5 carats, and was an Ib-type diamond single crystal containing nitrogen in the crystal. The diamond single crystal in Sample 12 was 0.15 carat, and was an Ib-type diamond single crystal containing nitrogen in the crystal.

Each of the diamond single crystals in Samples 1 to 12 was a crystal called a hexa-octahedral crystal in which a (111) plane forming an angle of 54.7° with a (100) plane was formed at eight corners of the hexahedron formed of the six (100) planes perpendicular to each other.

When each inside of the diamond single crystals of Samples 1 to 10 and 12 was observed by an optical microscope with a magnification of 50 times, a periodic structure having a constant period along the <100> direction was observed. Further, by observing by an optical microscope with a magnification of 200 times, the distance of one period along the <100> direction was measured, and the arithmetic average value $A_{ave}$, the maximum value $A_{max}$, and the minimum value $A_{min}$ were calculated. The results are shown in Table 1.

When the inside of the diamond single crystal of Sample 11 was observed by an optical microscope with a magnification of 50 times, a periodic structure was not observed.

In each of the diamond single crystals in Samples 1 to 12, plane distances of three sets of the (100) planes parallel to each other, and plane distances of four sets of the (111) planes parallel to each other were measured. The ratio $\beta/\alpha$ of the average value $\beta$ of a plane distance in four sets of (111) planes to the average value $\alpha$ of a plane distance in three sets of (100) planes were calculated. The results are shown in Table 1.

(Observation of Inclusion)

The inside of the diamond single crystal in each sample was observed by an optical microscope with a magnification of 30 times, and the presence or absence of the inclusion was confirmed. The crystals in which an inclusion was observed were subjected to observation in detail by an optical microscope with a magnification of 200 times, and the diameter and the number of each inclusion were measured. The results are shown in Table 1.

(Measurement of Nitrogen Concentration)

The nitrogen concentration in the diamond single crystal in each sample was determined by SIMS analysis. The results are shown in Table 1.

(Raman Spectroscopy)

Each sample was subjected to Raman spectroscopy at room temperature using a laser with a wavelength of 532 nm as the excitation light. The full width at half maximum of the peak was obtained by fitting the complex function of the Lorentz function and the Gaussian function to the diamond phonon peak obtained by spectral analysis with a spectrometer having a wavenumber resolution of less than or equal to 0.25 cm$^{-1}$ by a least squares method. The results are shown in Table 1.

(Infrared Spectroscopy)

After mirror polishing two surfaces for transmitting light of each sample, absorbance measurement in the infrared region was performed by a Fourier transform infrared spectrophotometer, and an extinction coefficient at a wave number of 1130 cm$^{-1}$ was determined.

(Lattice Constant Measurement)

Each sample was subjected to X-ray structure analysis using synchrotron radiation, and the lattice constant was determined.

(Breaking Strength Test)

A diamond indenter having a tip radius R of 50 μm was prepared, and by applying a load to each sample at a rate of 100 N/min at room temperature (23° C.), the load (N) at the moment when cracks occurred was measured. The moment when the cracks occur was measured with an AE sensor. It is indicated that the larger the cracking load is, the higher the strength of the sample is. The results are shown in Table 1.

<Performance Evaluation of Tool>

By using the obtained diamond single crystal, various kinds of tools containing the diamond single crystal were fabricated, and each performance was evaluated. Note that with Sample 9, a scribe wheel was not able to be fabricated due to the limitation of crystal size. With Sample 12 having an even smaller crystal size of 0.15 ct, tools other than the die were not able to be fabricated.

(Dresser Tool)

By using a diamond single crystal of each sample, a dresser tool in which the width of the part acting as a dresser is 1.5 mm was fabricated. By using the dresser tool for forming grindstone with hard particles of alumina, or the like, the lifetime of the dresser tool was evaluated. Evaluation conditions of the grindstone forming were set to be a grindstone rotation speed of 2200 rpm, a feed rate of 120 mm/min, and a cutting depth to grindstone of 0.05 mm. The time required until the state that the wear of the diamond crystal of the tool proceeded and the formation of the grindstone did not proceed was generated by using the dresser tool was measured, and the measured time was set to be the tool life.

In Table 1, by using the tool life of the tool fabricated from Sample 6 as a criterion (1), a tool life of a tool fabricated from each sample is shown as a relative value. The larger the value is, the more excellent the tool life is.

A lifetime of the tool fabricated from each of Samples 1 to 6 became greater than or equal to twice as compared with the lifetime of the tool fabricated from each of Sample 9 having a large variation in the periodic structure and Sample 11 having a small amount of nitrogen and recognizing an inclusion with a size of around 30 μm in the crystal. Further, a tool fabricated from each of Samples 1 to 6 showed higher tool life even as compared with the lifetime of the tool fabricated from each of Sample 7 having a periodic structure at wide intervals and Sample 8 having a periodic structure at narrow intervals.

In a case of using as a dresser tool, it is required to use the crystal plane orientation with high wear resistance as a tool. As to the diamond single crystal of each of Samples 1 to 6, in which the ratio ($\beta/\alpha$) of the plane distance of (111) plane to the plane distance of (100) plane is greater than or equal to 0.8 and less than or equal to 1.3, a dresser tool was able to be fabricated from a crystal with 0.75 to 1.0 ct. On the other hand, as to the diamond single crystal of each of Sample 11 having a short plane distance of (100) plane and being a flat plate shape and Sample 10 having a short plane distance of (111) plane, a large crystal is required in order to fabricate a dresser tool with the shape described above, and the cost became high.

(Wire Drawing Die)

By using a diamond single crystal of each sample, a die for thin wire drawing with a diameter (φ) of 0.05 mm was fabricated, and the wire drawing of Cu wire was evaluated. The drawing time of Cu wire required until the wire drawing diameter exceeded ϕ 0.055 mm or the circularity exceeded 5 µm due to the wear of the diamond single crystal was measured, and the measured time was set to be the tool life.

In Table 1, by using the tool life of the tool fabricated from Sample 6 as a criterion (1), a tool life of a tool fabricated from each sample is shown as a relative value. The larger the value is, the more excellent the tool life is.

A lifetime of the tool fabricated from each of Samples 1 to 6 and 12 became greater than or equal to twice as compared with the lifetime of the tool fabricated from each of Samples 9 and 10 having a large variation in the periodic structure and Sample 11 having a small amount of nitrogen and recognizing an inclusion with a size of around 30 µm in the crystal. Further, a tool fabricated from each of Samples 1 to 6 and 12 showed higher tool life even as compared with the lifetime of the tool fabricated from each of Sample 7 having a periodic structure at wide intervals and Sample 8 having a periodic structure at narrow intervals.

(Scribe Tool)

By using a diamond single crystal of each sample, a 4-point scribe tool was fabricated, and the 4-point scribe tool was subjected to a wear test with a load of 50 g, a scribing speed of 1 cm/min, and a scribing distance of 1 m, using a sapphire substrate as the mating material, and the wear resistance was evaluated.

In Table 1, the ratio of the wear amount of the tool fabricated from Sample 6 to the wear amount of the tool fabricated from each sample (wear amount of Sample 6/wear amount of each sample) is shown as an index of the wear resistance. The larger the value is, the more excellent the tool life is.

A lifetime of the tool fabricated from each of Samples 1 to 6 became greater than or equal to 1.5 times as compared with the lifetime of the tool fabricated from each of Samples 9 and 10 having a large variation in the periodic structure and Sample 11 having a small amount of nitrogen and recognizing an inclusion with a size of around 30 µm in the crystal. Further, a tool fabricated from each of Samples 1 to 6 showed higher tool life even as compared with the lifetime of the tool fabricated from each of Sample 7 having a periodic structure at wide intervals and Sample 8 having a periodic structure at narrow intervals.

(Cutting Tool)

By using a diamond single crystal of each sample, a cutting tool having a tip angle of 90° and a tip R of 100 nm was fabricated. By using a metal plate plated with nickel phosphorus as the mating material, grooving at a depth of 15 µm×30 µm pitch at a cutting speed of 100 m/min was performed, and the time required until the tip is worn by 1.5 µm was set to be the tool life.

In Table 1, by using the tool life of the tool fabricated from Sample 6 as a criterion (1), a tool life of a tool fabricated from each sample is shown as a relative value. The larger the value is, the more excellent the tool life is.

The wear resistance of the tool fabricated from each of Samples 1 to 6 became greater than or equal to twice as compared with the lifetime of the tool fabricated from each of Samples 9 and 10 having a large variation in the periodic structure and Sample 11 having a small amount of nitrogen and recognizing an inclusion with a size of around 30 µm in the crystal. Further, a tool fabricated from each of Samples 1 to 6 showed higher tool life even as compared with the lifetime of the tool fabricated from each of Sample 7 having a periodic structure at wide intervals and Sample 8 having a periodic structure at narrow intervals.

(Scribe Wheel)

By using a diamond single crystal of each sample, a scribe wheel having a diameter of 3 mm, a thickness of 0.8 mm, and a blade opening angle of 120° was fabricated. The scribe wheel was used to scribe a glass substrate as the mating material, the distance capable of being scribed was measured, and the measured distance was set to be the tool life.

In Table 1, by using the tool life of the tool fabricated from Sample 6 as a criterion (1), a tool life of a tool fabricated from each sample is shown as a relative value. The larger the value is, the more excellent the tool life is.

A lifetime of the tool fabricated from each of Samples 1 to 6 became greater than or equal to twice as compared with the lifetime of the tool fabricated from Sample 10 having a large variation in the periodic structure. Further, a tool fabricated from each of Samples 1 to 6 showed higher tool life even as compared with the lifetime of the tool fabricated from each of Sample 7 having a periodic structure at wide intervals and Sample 8 having a periodic structure at narrow intervals.

As to the tool fabricated from Sample 11 having a small amount of nitrogen and recognizing an inclusion with a size of around 30 µm in the crystal, the crystal was broken during the fabrication of a scribe wheel, therefore, the evaluation was not able to be performed.

(Orifice for Water Jet)

By using a diamond single crystal of each sample, an orifice for water jet with an orifice hole diameter of ϕ 150 µm and a height of 5 mm was fabricated. Water jet cutting was performed by using the orifice for water jet, the time required until the hole diameter of the orifice enlarged to ϕ 250 µm was measured, and the measured time was set to be the tool life.

In Table 1, by using the tool life of the tool fabricated from Sample 6 as a criterion (1), a tool life of a tool fabricated from each sample is shown as a relative value. The larger the value is, the more excellent the tool life is.

A lifetime of the tool fabricated from each of Samples 1 to 6 became greater than or equal to twice as compared with the lifetime of the tool fabricated from each of Samples 9 and 10 having a large variation in the periodic structure. Further, a tool fabricated from each of Samples 1 to 6 showed higher tool life even as compared with the lifetime of the tool fabricated from each of Sample 7 having a periodic structure at wide intervals and Sample 8 having a periodic structure at narrow intervals.

As to the tool fabricated from Sample 11 having a small amount of nitrogen and recognizing an inclusion with a size of around 30 µm in the crystal, the crystal was broken during the fabrication of a water jet, therefore, the evaluation was not able to be performed.

The embodiments and examples disclosed herein are examples in all respects, and should not be considered to be restrictive. The scope of the present invention is indicated not by the above-described embodiments but by the scope of claims, and is intended to include all modifications within the scope and meaning equivalent to the claims.

REFERENCE SIGNS LIST

1, 21: diamond single crystal, 2: insulator, 3: carbon source, 4: solvent metal, 5: seed crystal, 6: pressure medium, 7: graphite heater, 10: sample chamber

The invention claimed is:

1. A diamond single crystal, comprising nitrogen atoms, wherein a concentration of said nitrogen atoms changes periodically to repeatedly increase and decrease along a crystal orientation of said diamond single crystal, and an arithmetic average value $A_{ave}$, a maximum value $A_{max}$, and a minimum value $A_{min}$ of a distance of one period along said crystal orientation satisfy the relationship expressed by the following equation (I):

$$(A_{max})/1.25 \le (A_{ave}) \le (A_{min})/0.75 \qquad (I).$$

2. The diamond single crystal according to claim 1, wherein
said arithmetic average value $A_{ave}$ of said distance of one period is greater than or equal to 1 μm and less than or equal to 50 μm.

3. The diamond single crystal according to claim 1, wherein
said diamond single crystal contains nitrogen atoms in a concentration of greater than or equal to 10 ppm and less than or equal to 1000 ppm.

4. The diamond single crystal according to claim 1, wherein
said diamond single crystal has a full width at half maximum of a diamond phonon peak appearing at a Raman shift of 1332 cm$^{-1}$ in Raman spectroscopy of greater than or equal to 2.2 cm$^{-1}$ and less than or equal to 3.6 cm$^{-1}$.

5. The diamond single crystal according to claim 1, wherein
said diamond single crystal has an absorption coefficient at a wave number of 1130 cm$^{-1}$ in infrared spectroscopy at a thickness of 1 mm of greater than or equal to 0.5 cm$^{-1}$ and less than or equal to 44 cm$^{-1}$.

6. The diamond single crystal according to claim 1, wherein
said diamond single crystal has a lattice constant of greater than or equal to 3.56712 Å and less than or equal to 3.56755 Å as measured by X-ray diffraction.

7. The diamond single crystal according to claim 1, wherein
said diamond single crystal has a cracking load of greater than or equal to 5 N in a breaking strength test pressing a diamond indenter having a tip radius of 50 μm against a surface of the diamond single crystal at a loading rate of 100 N/min.

8. The diamond single crystal according to claim 1, wherein
said diamond single crystal has a size of greater than or equal to 0.2 carat.

9. The diamond single crystal according to claim 1, wherein
said diamond single crystal has a crystal form forming {111} planes at greater than or equal to four corners among eight corners of a hexahedron formed of a set of {100} planes, and said diamond single crystal has a ratio β/α of an average value β of a plane distance between planes parallel to each other in greater than or equal to two sets in {111} plane to an average value α of a plane distance between planes parallel to each other in three sets in {100} plane of greater than or equal to 0.8 and less than or equal to 1.3.

10. The diamond single crystal according to claim 1, wherein
said diamond single crystal includes an inclusion containing greater than or equal to one element selected from the group consisting of titanium, vanadium, chromium, manganese, iron, nickel, cobalt, copper, zirconium, niobium, molybdenum, ruthenium, rhodium, palladium, hafnium, tantalum, tungsten, osmium, iridium, and platinum; greater than or equal to one alloy containing greater than or equal to two elements of these elements; a compound of greater than or equal to one element selected from the group consisting of these elements and carbon or oxygen; and at least one kind selected from the group consisting of complexes of the compound, is included, and a content density of said inclusion is less than or equal to 20 pieces/mm$^3$.

11. The diamond single crystal according to claim 1, wherein
said diamond single crystal includes an inclusion containing greater than or equal to one element selected from the group consisting of titanium, vanadium, chromium, manganese, iron, nickel, cobalt, copper, zirconium, niobium, molybdenum, ruthenium, rhodium, palladium, hafnium, tantalum, tungsten, osmium, iridium, and platinum; greater than or equal to one alloy containing greater than or equal to two elements of these elements; a compound of greater than or equal to one element selected from the group consisting of these elements and carbon or oxygen; and at least one kind selected from the group consisting of complexes of the compound, is included, and said inclusion has a maximum diameter of less than or equal to 10 μm.

12. A tool, comprising the diamond single crystal according to claim 1.

* * * * *